(12) United States Patent
Shirakawa et al.

(10) Patent No.: US 10,962,607 B2
(45) Date of Patent: *Mar. 30, 2021

(54) METHOD FOR TESTING MULTICORE CABLE, METHOD FOR MANUFACTURING MULTICORE CABLE ASSEMBLY, AND MULTICORE CABLE TEST DEVICE

(71) Applicant: HITACHI METALS, LTD., Tokyo (JP)

(72) Inventors: Yohei Shirakawa, Tokyo (JP); Yoshitake Ageishi, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 111 days.

This patent is subject to a terminal disclaimer.

(21) Appl. No.: 16/197,473

(22) Filed: Nov. 21, 2018

(65) Prior Publication Data

US 2019/0212379 A1 Jul. 11, 2019

(30) Foreign Application Priority Data

Jan. 9, 2018 (JP) .............................. JP2018-001333

(51) Int. Cl.
*G01R 31/60* (2020.01)
*G01R 1/04* (2006.01)
*G01R 19/165* (2006.01)
*H01B 13/016* (2006.01)
(Continued)

(52) U.S. Cl.
CPC ............ *G01R 31/60* (2020.01); *G01R 1/0416* (2013.01); *G01R 19/16576* (2013.01); *G01R 31/083* (2013.01); *H01B 13/016* (2013.01); *H01B 13/067* (2013.01)

(58) Field of Classification Search
None
See application file for complete search history.

(56) References Cited

U.S. PATENT DOCUMENTS 5,384,540 A * 1/1995 Dessel .................. G01R 31/60
324/539
6,646,447 B2 * 11/2003 Cern ....................... H04B 3/56
324/522
(Continued)

FOREIGN PATENT DOCUMENTS

JP 2004-251771 A 9/2004

*Primary Examiner* — Nasima Monsur
(74) *Attorney, Agent, or Firm* — Scully, Scott, Murphy & Presser, PC

(57) ABSTRACT

A method for testing a multicore cable including not less than three insulated wires to identify a correspondence relationship between one end portion and an other end portion of the insulated wires exposed from both ends of the multicore cable. The method includes inputting a test signal, by capacitive coupling, to an end portion of the tested insulated wire among end portions of the insulated wires exposed at one end of the multicore cable, inputting a phase-inverted test signal in an opposite phase to that of the test signal, by capacitive coupling, to an end portion of the insulated wire, other than the end portion of the tested insulated wire, and measuring voltages of output signals output respectively from end portions of the insulated wires exposed at the other end of the multicore cable to identify an other end portion of the tested insulated wire based on the measured voltages.

12 Claims, 8 Drawing Sheets

(51) Int. Cl.
*H01B 13/06* (2006.01)
*G01R 31/08* (2020.01)

(56) References Cited

U.S. PATENT DOCUMENTS

| | | | | |
|---|---|---|---|---|
| 7,902,810 | B2* | 3/2011 | Naylor | G01R 31/69 |
| | | | | 324/66 |
| 8,896,287 | B2* | 11/2014 | Abuelsaad | H01R 4/64 |
| | | | | 324/66 |
| 2011/0000303 | A1* | 1/2011 | Fortner | G01L 9/12 |
| | | | | 73/724 |

* cited by examiner

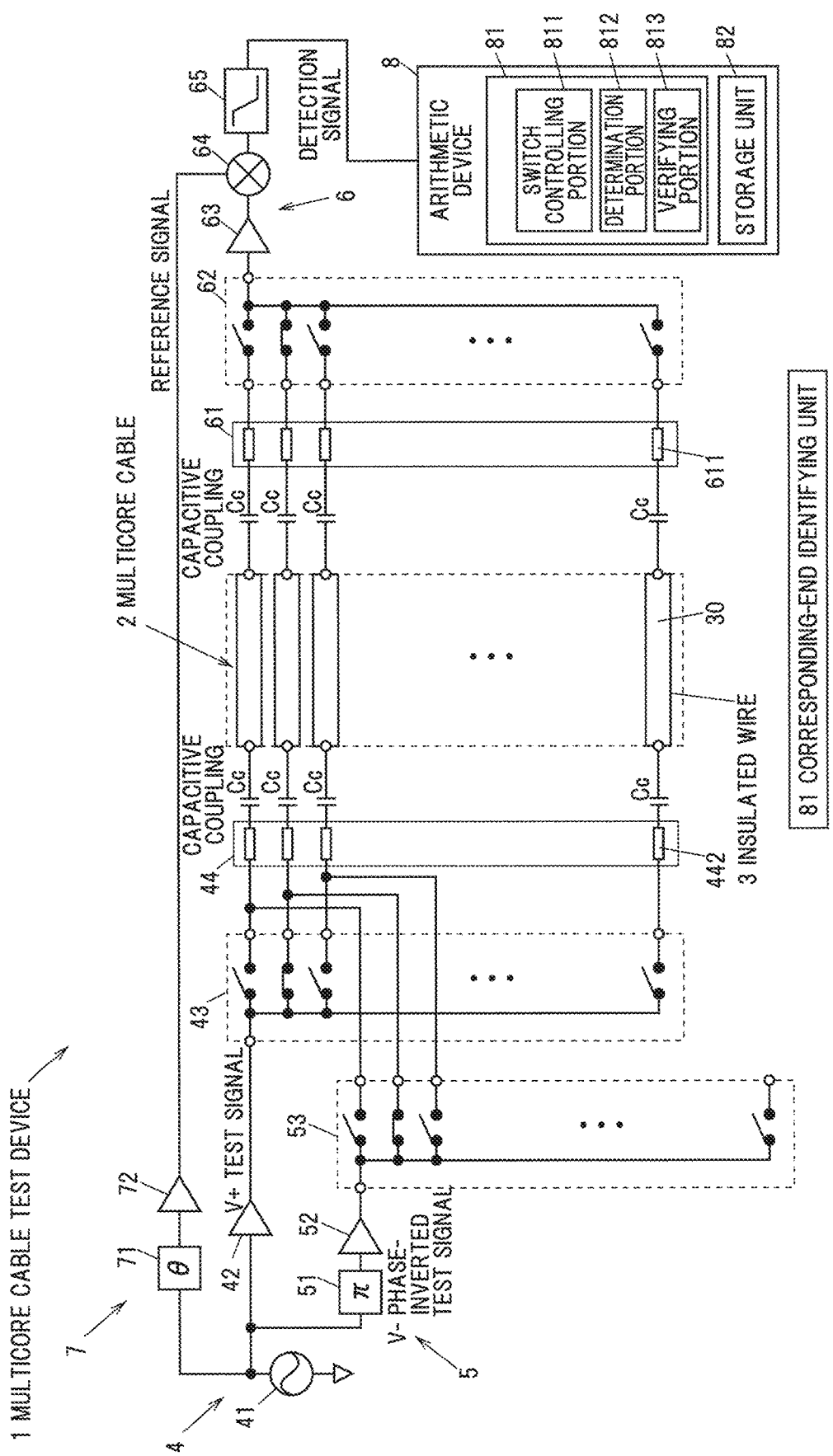

METHOD FOR TESTING MULTICORE CABLE, METHOD FOR MANUFACTURING MULTICORE CABLE ASSEMBLY, AND MULTICORE CABLE TEST DEVICE

The present application is based on Japanese patent application No. 2018-001333 filed on Jan. 9, 2018, the entire contents of which are incorporated herein by reference.

BACKGROUND OF THE INVENTION

1. Field of the Invention

The invention relates to a method for testing a multicore cable, a method for manufacturing a multicore cable assembly, and a multicore cable test device.

2. Description of the Related Art

A multicore cable in which multiple insulated wires each having an insulation around a conductor are collectively covered with a jacket is known. For example, some of multicore cables used for medical probe cable are known to have, e.g., several tens to several hundreds of insulated wires (coaxial wires, etc.).

For such multicore cable having multiple insulated wires, it is difficult to use a color code so that every insulated wire has a different color insulation. In addition, in case that the insulated wires are twisted together inside the multicore cable, each insulated wire is not located at the same position. Therefore, when connecting a multicore cable having multiple insulated wires to connectors or circuit boards, a test method is required to somehow identify a correspondence relationship between one end portion and the other end portion of each of the insulated wires exposed from both ends of the multicore cable.

As a test method to identify the correspondence relationship between one end portion and the other end portion of insulated wires contained in the multicore cable, for example, there is a method in which a test signal is input to one end portion of a given insulated wire and voltage output from the other end portion is measured.

To test the multicore cable having multiple insulated wires, when a conductor of each insulated wire is exposed at an end portion and an electrode for supplying a test signal is directly brought into contact with the conductor, it is necessary to bring the electrode into contact with the conductor of every insulated wire to identify the correspondence relationship and it thus takes very long time for the test. Therefore, the test to identify the correspondence relationship between one end portion and the other end portion of insulated wires contained in a multicore cable having plural insulated wires is desired to be conducted by a method in which an electrode is placed on an insulation and an AC test signal is input to a conductor by capacitive coupling without contact (see, e.g., JP 2004/251771 A).

SUMMARY OF THE INVENTION

In the test method of inputting an AC test signal to the conductor without contact, if multiple insulated wires are densely arranged in a multicore cable and when input of an AC test signal and output of an AC output signal are performed without contact, crosstalk between the insulated wires may increase. As a result, the correspondence relationship between one end portion and the other end portion of the insulated wires may sometimes not be accurately identified due to the crosstalk.

It is an object of the invention to provide a method for testing a multicore cable that can reduce the effect of crosstalk when performing input of an AC test signal and output of an AC output signal without contact to accurately identify the correspondence relationship between one end portion and the other end portion of insulated wires, as well as a method for manufacturing a multicore cable assembly and a multicore cable test device.

According to an embodiment of the invention, a method for testing a multicore cable comprising not less than three insulated wires collectively covered with a jacket to identify a correspondence relationship between one end portion and an other end portion of the insulated wires exposed from both ends of the multicore cable comprises:

inputting a test signal, by capacitive coupling, to an end portion of the tested insulated wire among end portions of the insulated wires exposed at one end of the multicore cable;

inputting a phase-inverted test signal in an opposite phase to that of the test signal, by capacitive coupling, to an end portion of the insulated wire, other than the end portion of the tested insulated wire, among the end portions of the insulated wires exposed at the one end of the multicore cable; and measuring voltages of output signals output by capacitive coupling respectively from end portions of the insulated wires exposed at the other end of the multicore cable to identify an other end portion of the tested insulated wire based on the measured voltages.

According to another embodiment of the invention, a method for manufacturing a multicore cable assembly that comprises a multicore cable comprising not less than three insulated wires collectively covered with a jacket and connectors or circuit boards provided at both ends of the multicore cable, the manufacturing method comprising:

arranging wires;

stripping the insulated wires to expose conductors at end portions; and connecting the exposed conductors to terminals of the connectors or electrode patterns of the circuit board, wherein the arranging wire comprises identifying a corresponding end portion by identifying a correspondence relationship between one end portion and an other end portion of the insulated wires exposed from both ends of the multicore cable and arranging end portions of the insulated wires exposed from the both ends of the multicore cable in desired order, and wherein the identifying of the corresponding end portion comprises:

inputting a test signal, by capacitive coupling, to an end portion of the tested insulated wire among end portions of the insulated wires exposed at one end of the multicore cable;

inputting a phase-inverted test signal in an opposite phase to that of the test signal, by capacitive coupling, to an end portion of the insulated wire, other than the end portion of the tested insulated wire, among the end portions of the insulated wires exposed at the one end of the multicore cable; and measuring voltages of output signals output by capacitive coupling respectively from end portions of the insulated wires exposed at an other end of the multicore cable to identify the other end portion of the tested insulated wire based on the measured voltages.

According to another embodiment of the invention, a multicore cable test device for testing a multicore cable comprising not less than three insulated wires collectively covered with a jacket to identify a correspondence relationship between one end portion and an other end portion of the insulated wires exposed from both ends of the multicore cable comprises:

a test signal input means that inputs a test signal, by capacitive coupling, to an end portion of the tested insulated wire among end portions of the insulated wires exposed at one end of the multicore cable;

a phase-inverted test signal input means that inputs a phase-inverted test signal in an opposite phase to that of the test signal, by capacitive coupling, to an end portion of the insulated wire, other than the end portion of the tested insulated wire, among the end portions of the insulated wires exposed at the one end of the multicore cable; and a corresponding-end identifying unit that measures output voltages output by capacitive coupling respectively from end portions of the insulated wires exposed at an other end of the multicore cable to identify the other end portion of the tested insulated wire based on the measured output voltages.

Effects of the Invention

According to an embodiment of the invention, a method for testing a multicore cable can be provided that can reduce the effect of crosstalk when performing input of an AC test signal and output of an AC output signal without contact to accurately identify the correspondence relationship between one end portion and the other end portion of insulated wires, as well as a method for manufacturing a multicore cable assembly and a multicore cable test device.

BRIEF DESCRIPTION OF THE DRAWINGS

Next, the present invention will be explained in more detail in conjunction with appended drawings, wherein:

FIG. 1 is a schematic configuration diagram illustrating a multicore cable test device which is used in a method for testing a multicore cable in an embodiment of the present invention;

FIGS. 5A to 5C are explanatory diagrams illustrating the principle of the method for testing a multicore cable, wherein FIG. 5A is a diagram illustrating an example of voltage of an output signal when only a test signal is input, FIG. 5B is a diagram when only a phase-inverted test signal is input, and FIG. 5C is a diagram when both the test signal and the phase-inverted test signal are input;

DETAILED DESCRIPTION OF THE PREFERRED EMBODIMENTS

Embodiment

An embodiment of the invention will be described below in conjunction with the appended drawings.

Multicore Cable Test Device

Figure 2A:
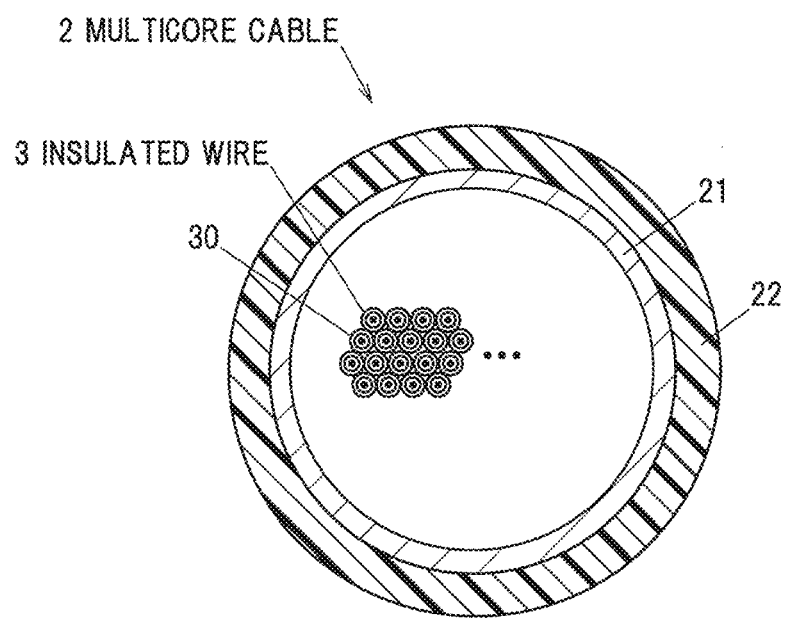
FIG. 2A is a schematic cross-sectional view showing a multicore cable taken perpendicular to a longitudinal direction.

FIG. 1 is a schematic configuration diagram illustrating a multicore cable test device which is used in a method for testing a multicore cable in the present embodiment. FIG. 2A is a schematic cross-sectional view showing a multicore cable taken perpendicular to a longitudinal direction and FIG. 2B is a cross sectional view showing an insulated wire taken perpendicular to the longitudinal direction.

A multicore cable test device 1 is used to identify a correspondence relationship between one end portion and the other end portion of each insulated wire 3 exposed at both ends of a multicore cable 2. After identifying the correspondence relationship between one end portion and the other end portion of the insulated wires 3 of the multicore cable 2, the insulated wires 3 at both ends of the multicore cable 2 are respectively connected to connectors or circuit boards (internal boards in sensor portions, etc.) (not shown in the drawings) according to the identified correspondence relationship, and a multicore cable assembly is thereby obtained.

Figure 2B:
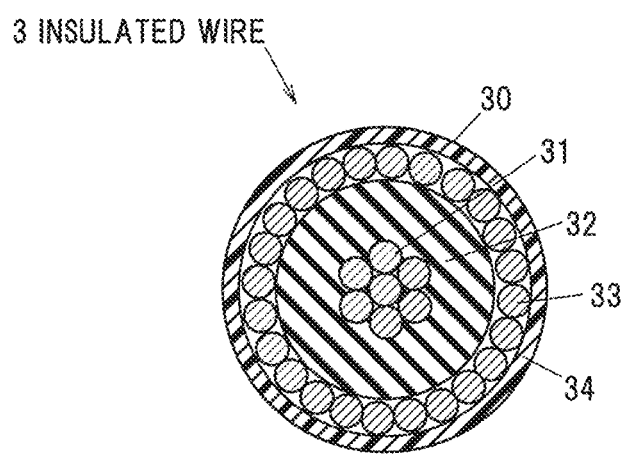
FIG. 2B is a cross sectional view showing an insulated wire taken perpendicular to the longitudinal direction.

As shown in FIGS. 2A and 2B, the insulated wire 3 used in the multicore cable 2 is a coaxial wire 30 in which an insulation 32, an outer conductor 33 and an outer covering 34 are sequentially provided around a center conductor 31. However, the insulated wire 3 is not limited thereto and may not have the insulation 32 and the outer conductor 33. The outer diameter of the coaxial wire 30 is, e.g., 0.2 mm to 0.5 mm. The multicore cable 2 is formed by sequentially providing a braided common shield 21 and a jacket 22 around multiple bundled coaxial wires 30. The number of insulated wires 3 in the multicore cable 2 is not specifically limited, and the invention is applicable to the multicore cable 2 having not less than three insulated wires 3. In the present embodiment, the number of insulated wires 3 contained in one multicore cable 2 is, e.g., about ten to three hundred.

Back to FIG. 1, the multicore cable test device 1 is provided with a test signal input means 4, a phase-inverted test signal input means 5, an output-side processing circuit 6, a reference signal generating circuit 7, and an arithmetic device 8 having a corresponding-end identifying unit 81.

The test signal input means 4 inputs an AC test signal V+, by capacitive coupling, to an end portion of the tested insulated wire 3 among end portions of the insulated wires 3 exposed at one end of the multicore cable 2. In the present embodiment, the test signal input means 4 has a voltage source 41 for generating the test signal V+, a first amplifier 42 for amplifying the test signal V+, a first switching device 43 for switching the insulated wire 3 to which the test signal V+ amplified by the first amplifier 42 is input, and an electrode substrate 44 having plural electrodes 442 which are respectively electrically connected to outputs of the first switching device 43. The electrode substrate 44 is configured so that the test signal V+ is input to the insulated wire 3 by capacitive coupling when bringing the electrode 442 into contact with an outer circumferential surface of the insulated wire 3.

In the present embodiment, since capacitive coupling is used to input the test signal to the insulated wires 3, an AC signal is used as the test signal. The frequency of the test signal needs to be smaller than the resonant frequency of the multicore cable 2, and can be appropriately determined depending on the structure, etc., of the multicore cable 2. In more detail, the frequency of the test signal V+ is, e.g., not more than 10 MHz. In the present embodiment, the test signal V+ at 2.5 MHz is used.

Figure 3A:
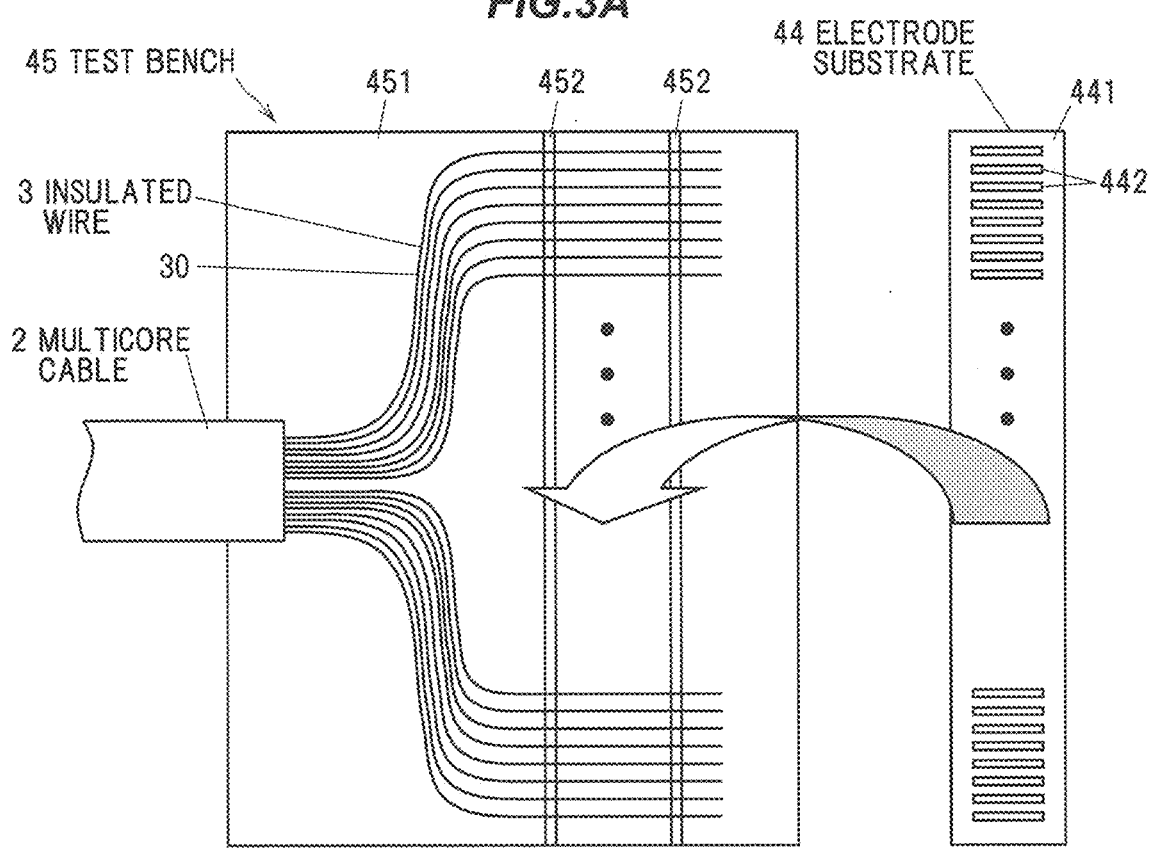
FIGS. 3A and 3B are explanatory diagrams illustrating the insulated wires fixed to a test bench.
Figure 3B:
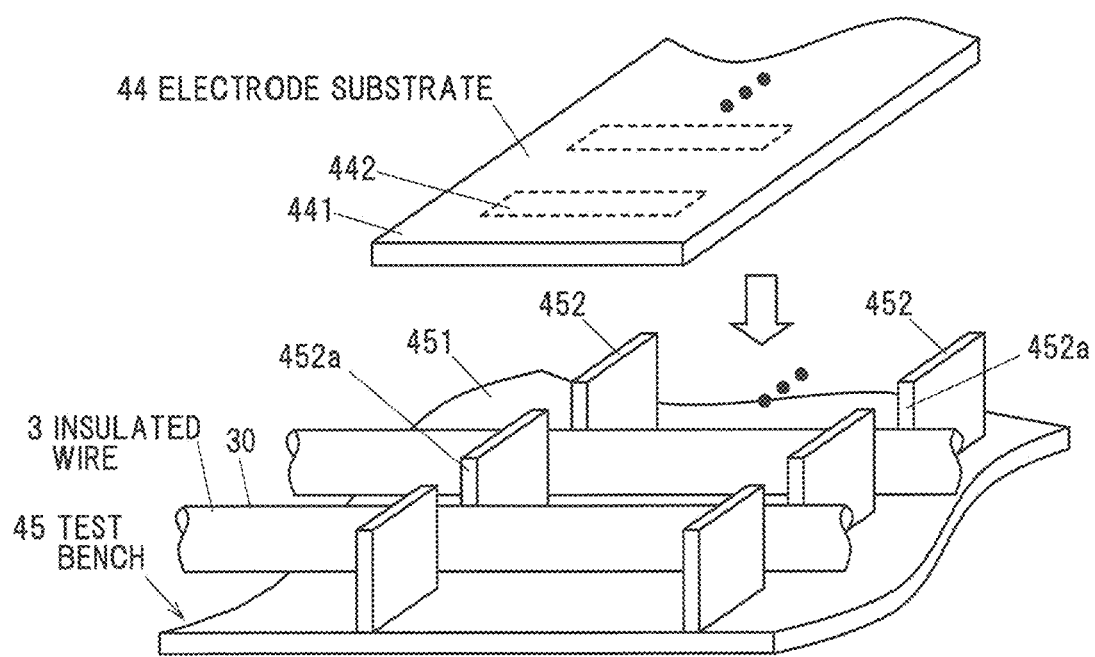

As shown in FIGS. 3A and 3B, the insulated wires 3 (the coaxial wires 30 in this example) exposed and aligned at one end of the multicore cable 2 are fixed to a test bench 45. The test bench 45 integrally has a base 451 and a pair of locking walls 452 arranged on the base 451 so as to face each other. Plural locking grooves 452a for locking the insulated wires 3 are formed at equal intervals on the both locking walls 452. The insulated wires 3 are respectively fitted and fixed to the locking grooves 452a and are thereby arranged in a row on the base 451 at predetermined intervals. However, the structure to fix the insulated wires 3 to the test bench 45 is not limited thereto. For example, the insulated wires 3 may be placed on an adhesive tape such as double-sided tape stuck to the base 451 so that the insulated wires 3 are adhered and fixed to the test bench 45. In addition, although the insulated wires 3 are arranged in a row at equal intervals in one direction (a direction perpendicular to a longitudinal direction of the insulated wire 3), arrangement of the insulated wires 3 may be appropriately changed.

The electrode substrate 44 has a dielectric substrate 441 and the electrodes 442 constructed from a wiring pattern formed on the dielectric substrate 441. The same number of electrodes 442 as the insulated wires 3 (or more than the insulated wires 3) are formed in alignment on the dielectric substrate 441 at the same intervals as the insulated wires 3 fixed to the locking grooves 452a. In addition, the electrodes 442 are respectively connected to the outputs of the first switching device 43 and the test signal V+ is applied to the electrode 442 selected by the first switching device 43.

In the present embodiment, the electrode substrate 44 is pressed, with a surface having the electrodes 442 facing downward, against the insulated wires 3 between the two locking walls 452. Thus, the electrodes 442 and the insulated wires 3 are sandwiched between the dielectric substrate 441 and the base 451. When the test signal V+ is applied to a given electrode 442 in this state, the test signal V+ is input to the insulated wire 3 corresponding to the given electrode 442 by capacitive coupling. In the present embodiment in which the coaxial wire 30 is used as the insulated wire 3, the test signal V+ is input to the outer conductor 33 of the insulated wire 3.

Back to FIG. 1, the phase-inverted test signal input means 5 has a first phase shifter 51 for shifting the phase of the test signal V+ branched from the voltage source 41 by 180 degrees to generate a phase-inverted test signal V−, a second amplifier 52 for amplifying the phase-inverted test signal V− from the first phase shifter 51, and a second switching device 53 for switching the insulated wire 3 to which the phase-inverted test signal V− amplified by the second amplifier 52 is input. Outputs of the second switching device 53 are respectively electrically connected to the electrodes 442 of the electrode substrate 44.

In the present embodiment, the phase-inverted test signal V− is generated by adjusting the phase of the voltage source 41 of the test signal input means 4. However, it is not limited thereto and a voltage source for generating the phase-inverted test signal V− may be separately provided. In this case, voltage (amplitude) of the phase-inverted test signal V− is substantially the same as that of the test signal V+. In addition, although the electrode substrate 44 of the test signal input means 4 is also used to input the phase-inverted test signal V− to the insulated wires 3 in the present embodiment, it is not limited thereto. An electrode substrate for inputting the phase-inverted test signal V− may be separately provided.

The output-side processing circuit 6 has a test bench (not shown) having the same structure as the test bench 45 and provided at an end of the multicore cable 2, and is configured that output signals from the insulated wires 3 (signals transmitted through the outer conductors 33) are output by capacitive coupling by pressing electrodes 611 of an electrode substrate 61 respectively against the insulated wires 3. Since the test bench and the electrode substrate 61 of the output-side processing circuit 6 have the same configurations as the test bench 45 and the electrode substrate 44, the explanation thereof is omitted.

The output-side processing circuit 6 also has a third switching device 62 electrically connected to each electrode 611 of the electrode substrate 61 to switch the insulated wire 3 from which an output signal is output, a third amplifier 63 for amplifying the output signal from the third switching device 62, a multiplier 64 which produces a detection signal by multiplying the output signal amplified in the third amplifier 63 by a reference signal having the same phase as the test signal V+, and a low-pass filter 65 which removes high-frequency components in the detection signal sent from the multiplier 64.

When signals having the same phase and the same frequency are multiplied with each other by the multiplier 64, a DC component and a component with a frequency double the original frequency are generated. The low-pass filter 65 removes the component with a doubled frequency and outputs only the DC component as the detection signal to the arithmetic device 8.

The reference signal generating circuit 7 has a second phase shifter 71 which produces a reference signal by adjusting the phase of the test signal V+ branched from the voltage source 41, and a fourth amplifier 72 which amplifies the reference signal from the second phase shifter 71 and outputs it to the multiplier 64. The phase shift amount by the second phase shifter 71 is appropriately adjusted by taking into consideration capacitive coupling and phase shifting during transmission through the multicore cable 2, so that the test signal V+ and the reference signal have the same phase in the multiplier 64.

The arithmetic device 8 has the corresponding-end identifying unit 81 which measures voltages of the output signals respectively output from end portions of the insulated wires 3 exposed at the other end of the multicore cable 2 and identifies the other end portion of the tested insulated wire 3 based on the measured voltages of the output signals. In the present embodiment, the corresponding-end identifying unit 81 is configured to identify the other end portion of the tested insulated wire 3 based on voltage of the detection signal output from the low-pass filter 65. The corresponding-end identifying unit 81 is realized by appropriately combining a CPU, a memory such as RAM or ROM, a storage device such as hard disc, a software, and an interface, etc.

The corresponding-end identifying unit 81 has a switch controlling portion 811 which controls switching operations of the first to third switching devices 43, 53 and 62, and a determination portion 812 which determines the correspondence relationship between one end portion and the other end portion of the insulated wire 3. In the present embodiment, the determination portion 812 controls the first switching device 43 through the switch controlling portion 811 to input the test signal V+ to an end portion of the tested insulated wire 3 at one end of the multicore cable 2, and also controls the second switching device 53 to input the phase-inverted test signal V− to an end portion of a given insulated wire 3. After that, the determination portion 812 controls the third switching device 62 and sequentially measures voltages of the detection signals from all insulated wires 3 at the other end of the multicore cable 2.

The determination portion 812 identifies that the end portion with the detection signal having the largest voltage, among end portions of the insulated wires 3 exposed at the other end of the multicore cable 2, is the other end portion of the tested insulated wire 3, and stores the correspondence relationship in a storage unit 82. To express the correspondence relationship between one end portion and the other end portion of the insulated wire 3, e.g., the numbers sequentially assigned to end portions of the insulated wires 3 arrange in a row at one end of the multicore cable 2 are associated with the numbers sequentially assigned to end portions of the insulated wires 3 arrange in a row at the other end of the multicore cable 2. The determination portion 812 sequentially changes the insulated wire 3 to be tested, identifies the correspondence relationship between one end portion and the other end portion of all insulated wires 3, and stores the identified relation in the storage unit 82.

In the present embodiment, the corresponding-end identifying unit 81 also has a verifying portion 813 which determines whether or not an end portion of any of the insulated wires 3 exposed at one end of the multicore cable 2 corresponds to duplicate other end portions. The verifying portion 813 checks if any of the numbers assigned to the other end portions of the insulated wires 3 is duplicated in the correspondence relationship which is determined by the determination portion 812 and is stored in the storage unit 82, thereby determining whether or not there is a duplication. This is performed because depending on the positional relation between the insulated wires 3 receiving an input of the test signal V+ and the phase-inverted test signal V−, the common shield 21 and the insulated wire 3 from which the detection signal is acquired, crosstalk of the test signal V+ and crosstalk of the phase-inverted test signal V− may become imbalanced, resulting in misdetection. When it is determined that there is a duplication, the verifying portion 813 changes the insulated wire 3 to which the phase-inverted test signal V− is input, and re-identifies the correspondence relationship between one end portion and the other end portion of at least the tested insulated wire 3 having duplicate end portions at the other end.

In the present embodiment, determination of the correspondence relationship between one end portion and the other end portion is also performed on the insulated wire 3 receiving an input of the phase-inverted test signal V− in the same manner as the other insulated wires 3 due to the circuit configuration, and misdetection is highly likely to occur in at least the insulated wire 3 receiving an input of the phase-inverted test signal V−. Therefore, in the present embodiment, the verifying portion 813 determines, at least once, that there is a duplication, and identifies the correspondence relationship between one end portion and the other end portion of the insulated wire 3 having a duplication.

Reason why the Effect of Crosstalk is Reduced

Figure 4A:
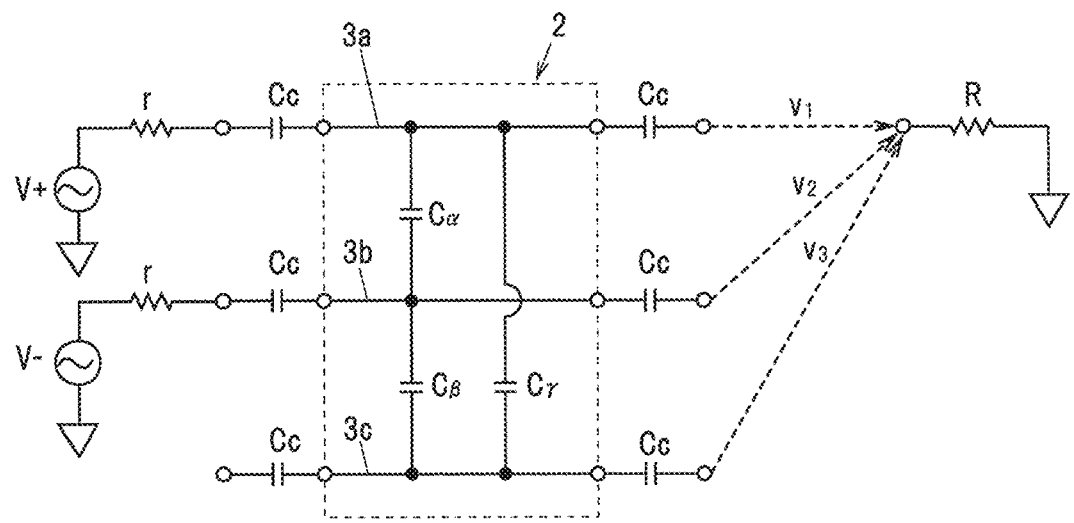
FIG. 4A is a diagram illustrating an equivalent circuit when testing the multicore cable by the multicore cable test device.

Now, the reason why the effect of crosstalk is reduced in the present embodiment is described. FIG. 4A is a diagram illustrating an equivalent circuit when testing the multicore cable 2 by the multicore cable test device 1. Only one of the insulated wires 3 not receiving input of the test signal V+ and the phase-inverted test signal V− is shown as a representative example. In this description, the insulated wire 3 to which the test signal V+ is input is referred to as "first insulated wire $3a$", the insulated wire 3 to which the phase-inverted test signal V− is input is referred to as "second insulated wire $3b$", and the insulated wire 3 to which the test signal V+ and the phase-inverted test signal V− is not input are referred to as "third insulated wire $3c$".

In addition, Cc is coupling capacitance at a capacitive coupling portion of an end portion of each insulated wire 3, $C\alpha$ is coupling capacitance between the first and second insulated wires $3a$ and $3b$, $C\beta$ is coupling capacitance between the second and third insulated wires $3b$ and $3c$, $C\gamma$ is coupling capacitance between the first and third insulated wires $3a$ and $3c$, and v1 to v3 are voltages of output signals of the first to third insulated wires $3a$ to $3c$.

A signal-to-noise ratio (SNR) in the present embodiment is expressed by the following formula (1) when $C\alpha \gg Cc$, $C\beta \gg Cc$, $C\gamma \gg Cc$, and $r+R \ll (1/\omega Cc)$.

$$SNR = |v1/v3| \qquad (1)$$
$$\approx |(C\gamma + C\beta)/(C\gamma - C\beta)|$$

Based on the formula (1), the SNR>1 since $C\gamma$ and $C\beta$ have substantially the same value. Thus, it is possible to identify an end portion of the insulated wire 3 to which the test signal V+ is input.

Figure 4B:
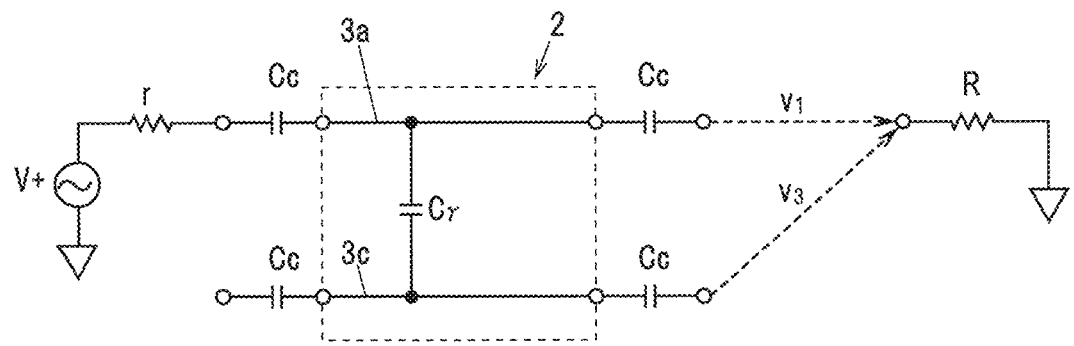
FIG. 4B is a diagram illustrating an equivalent circuit in which an insulated wire receiving an input of a phase-inverted test signal is not provided for the purpose of comparison with the invention.

Meanwhile, in the case that the phase-inverted test signal V− is not input to any insulated wires 3 and there is no second insulated wire $3b$ as shown in FIG. 4B, the SNR is expressed by the following formula (2) when $C\gamma \gg Cc$ and $r+R \ll (1/\omega Cc)$.

$$SNR = |v1/v3| \qquad (2)$$
$$\approx 1 + (1/2) \cdot (Cc/C\gamma)$$

Based on the formula (2), the SNR is substantially 1 since $C\gamma \gg Cc$, and it is difficult to identify an end portion of the insulated wire 3 to which the test signal V+ is input.

Figure 5A:
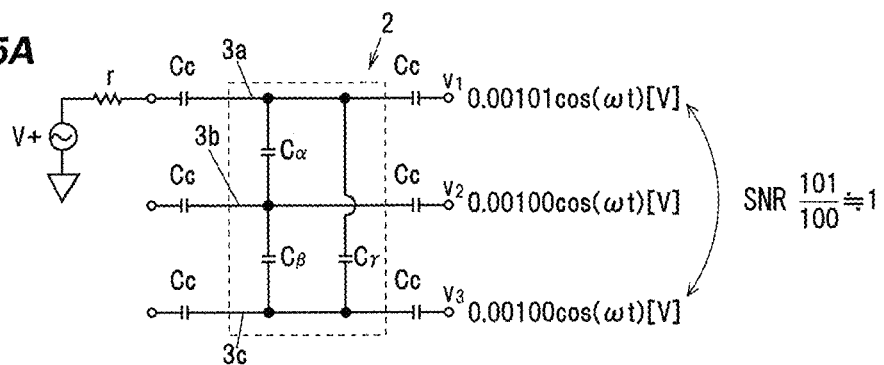

In more detail, for example, the test signal V+ is input to the first insulated wire $3a$ and AC voltage v1 with an amplitude of 0.00101V is output from an end portion of the first insulated wire $3a$ as shown in FIG. 5A. In the drawing, w indicates an angular frequency and t indicates time. In the state in which the phase-inverted test signal V− is not input, AC voltages v2 and v3 with an amplitude of 0.00100V, which is slightly smaller than that of the first insulated wire $3a$, are output from end portions of the second and third insulated wires $3b$ and $3c$ due to losses caused by capacitive coupling. The SNR (|v1/v3|) in this case is substantially 1 and it is difficult to identify an end portion of the insulated wire 3 to which the test signal V+ is input.

Figure 5B:
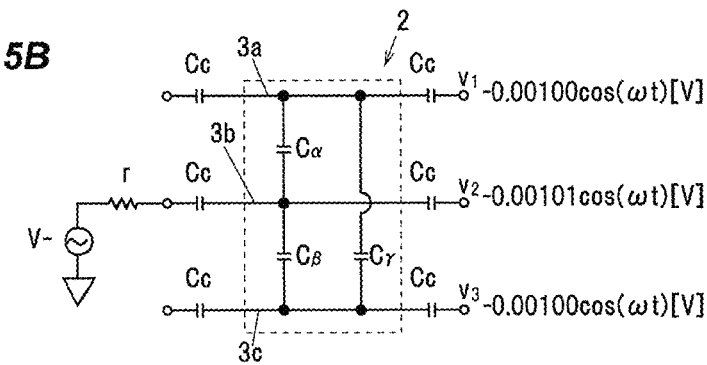

Likewise, when the phase-inverted test signal V− with the same amplitude as the test signal V+ is input to the second insulated wire $3b$ as shown in FIG. 5B, AC voltage v2 with an amplitude of −0.00101V is output from an end portion of the second insulated wire 3b. In the state in which the test signal V+ is not input, AC voltages v1 and v3 with an amplitude of −0.00100V, which is slightly smaller in absolute value than that of the second insulated wire 3b, are output from end portions of the first and third insulated wires 3a and 3c due to losses caused by capacitive coupling.

Figure 5C:
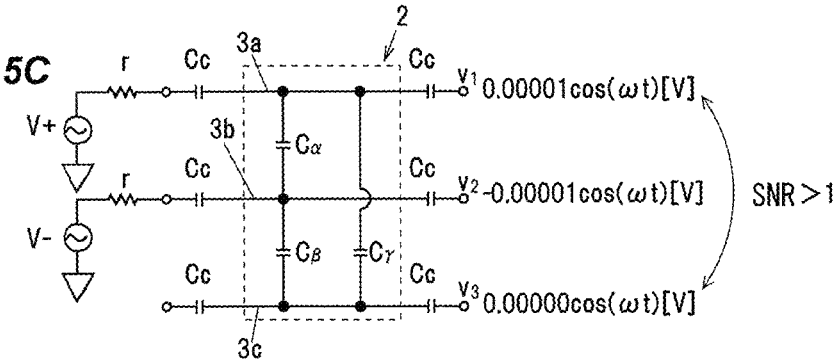

Thus, when the test signal V+ is input to the first insulated wire 3a and the phase-inverted test signal V− is input to the second insulated wire 3b as shown in FIG. 5C, the state shown in FIG. 5A is combined with the state shown in FIG. 5B and AC voltage v1 of 0.00101 cos(ωt)−0.00100 cos(ωt)= 0.00001 cos(ωt)V is output from an end portion of the first insulated wire 3a, AC voltage v2 of 0.00100 cos(ωt)− 0.00101 cos(ωt)=−0.00001 cos(ωt)V is output from an end portion of the second insulated wire 3b, and AC voltage v3 of 0.00100 cos(ωt)−0.00100 cos(ωt)=0.00000 cos(ωt)V is output from an end portion of the third insulated wire 3c. This results in the SNR (|v1/v3|)>>1, and it is possible to accurately identify an end portion of the insulated wire 3 to which the test signal V+ is input.

Method for Manufacturing Multicore Cable Assembly

Figure 6A:
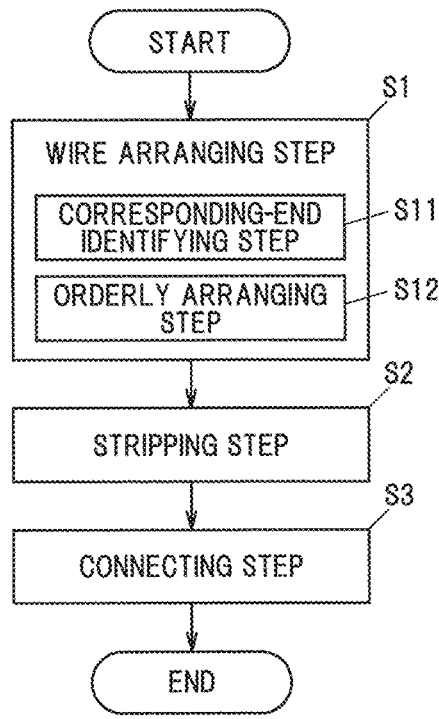
FIG. 6A is a flowchart showing a method for manufacturing a multicore cable assembly.

FIG. 6A is a flowchart showing a method for manufacturing a multicore cable assembly. As shown in FIG. 6A, the method for manufacturing a multicore cable assembly in the present embodiment includes a wire arranging step as Step S1, a stripping step as Step S2 and a connecting step as Step S3 which are performed sequentially.

In the wire arranging step as Step S1, a corresponding-end identifying step to identify a correspondence relationship between one end portion and the other end portion of the insulated wires 3 exposed from both ends of the multicore cable 2 is performed in Step S11 by the method for testing a multicore cable in the present embodiment, and an orderly arranging step to arrange the end portions of the insulated wires 3 exposed from both ends of the multicore cable 2 in desired order is then performed in Step S12. In the stripping step as Step S2, the exposed length of each insulated wire 3 is adjusted (by cutting and removing an excess length), and also the conductor (the center conductor 31 and the outer conductor 33 in this example) is exposed at ends of each insulated wire 3. In the connecting step as Step S3, the exposed conductors are connected to terminals of connectors or electrode patterns of circuit boards (not shown), etc., by soldering, etc. Through these steps, a multicore cable assembly having connectors or circuit boards at both ends of the multicore cable 2 is obtained.

Method for Testing the Multicore Cable

Figure 6B:
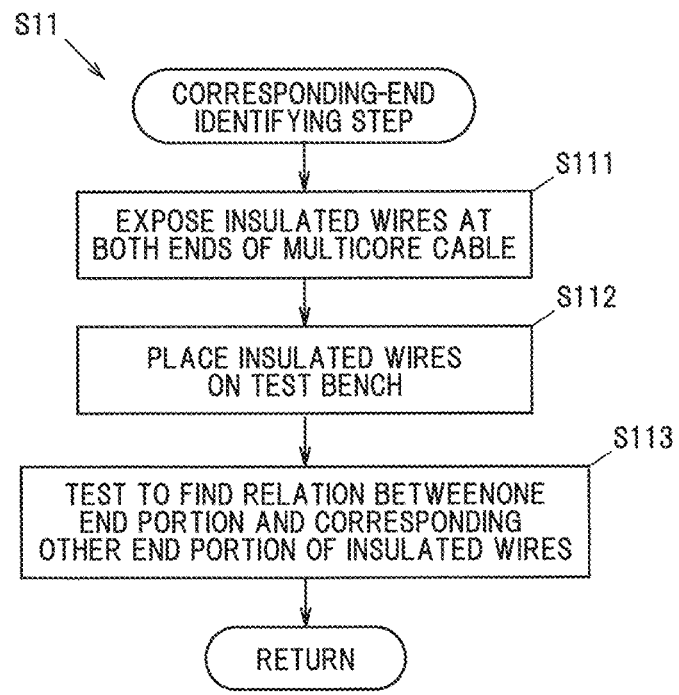
FIG. 6B is a flowchart showing a process of a corresponding-end identifying step in the manufacturing method.

FIG. 6B is a flowchart showing a process of the corresponding-end identifying step as Step S11. As shown in FIG. 6B, in the corresponding-end identifying step as Step S11, i.e., in the method for testing a multicore cable in the present embodiment, firstly, the insulated wires 3 are exposed at both ends of the multicore cable 2 by removing a predetermined length of the jacket 22 and the common shield 21 in Step S111. After that, in Step S112, the exposed insulated wires 3 are respectively fitted to the locking grooves 452a of the test bench 45 at both ends of the multicore cable 2, and the electrode substrates 44 and 61 are pressed against the insulated wires 3 which are fixed to the test bench 45. Then, a test is conducted to identify a correspondence relationship between one end portion and the other end portion of each insulated wire 3 in Step S113.

Figure 7:
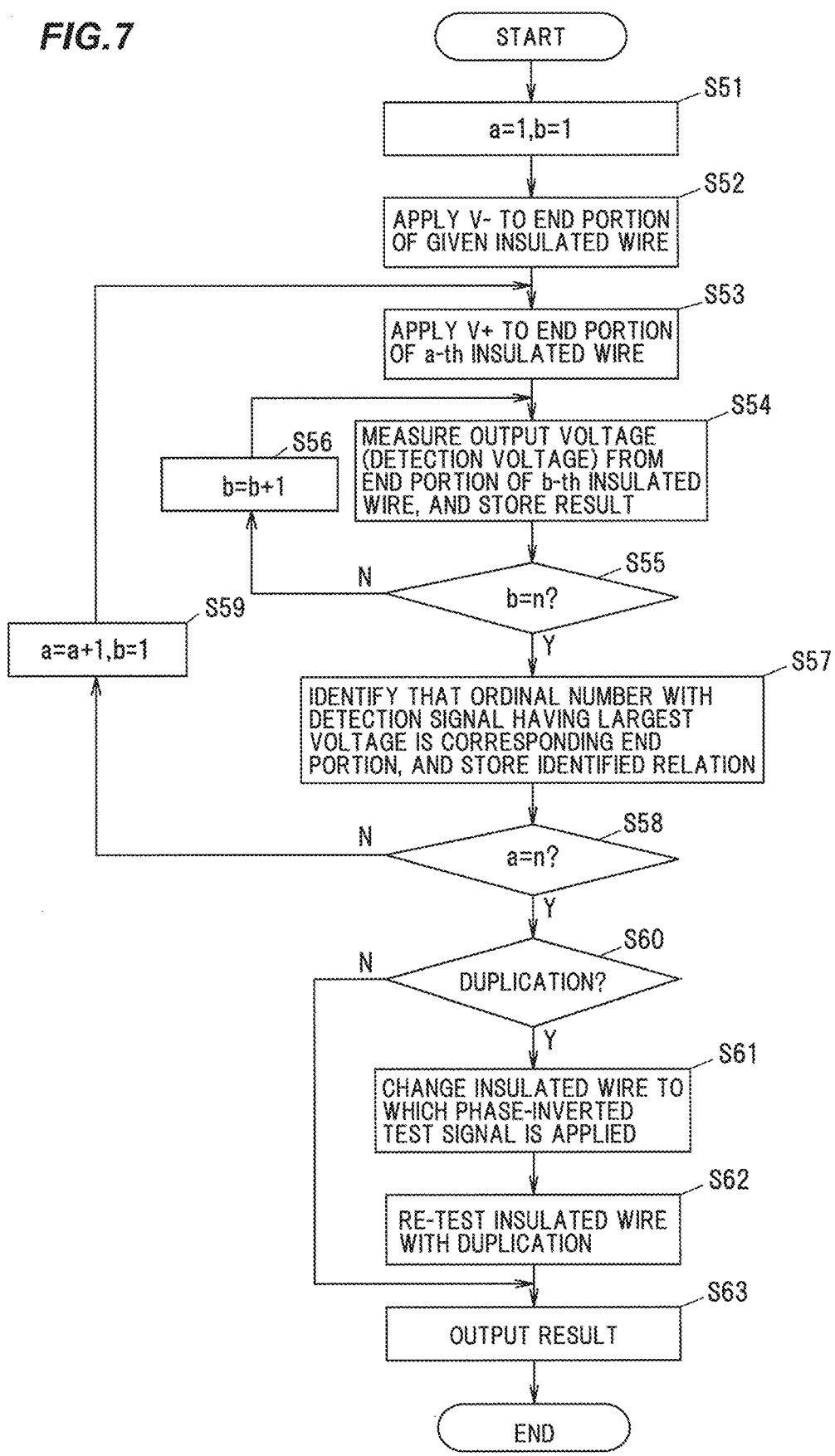
FIG. 7 is a flowchart showing a control flow of an arithmetic device when testing a correspondence relationship between one end portion and the other end portion of insulated wires.

FIG. 7 is a flowchart showing a control flow of the arithmetic device 8 when conducting a test to identify the correspondence relationship between one end portion and the other end portion of the insulated wires 3 in Step S113. In this example, the number of the insulated wires 3 is n, and the sequential order of the insulated wires 3 arranged on the test bench 45 is expressed as $1^{st}, 2^{nd}, \ldots n^{th}$.

Firstly, the determination portion 812 assigns an initial value of 1 to variables a and b in Step S51, as shown in FIG. 7. After that, in Step S52, the determination portion 812 controls the second switching device 53 through the switch controlling portion 811 and applies the phase-inverted test signal V− to a given insulated wire 3. In this regard, although the insulated wire 3 to which the phase-inverted test signal V− is applied in Step S51 can be randomly selected, the insulated wire 3 other than $a^{th}$ is selected in this example.

Then, in Step S53, the determination portion 812 controls the first switching device 43 through the switch controlling portion 811 and applies the test signal V+ to the $a^{th}$ insulated wire 3. By Steps S52 and S53, the test signal V+ is input by capacitive coupling to an end portion of the $a^{th}$ tested insulated wire 3 among end portions of the insulated wires 3 exposed at one end of the multicore cable 2, and also the phase-inverted test signal V− is input by capacitive coupling to an end portion of the insulated wire 3 other than the end portion of the $a^{th}$ tested insulated wire 3.

Then, in Step S54, the determination portion 812 controls the third switching device 62 through the switch controlling portion 811, measures voltage of an output signal (in this example, a detection signal produced by multiplying the output signal by a reference signal) output from an end portion of the $b^{th}$ insulated wire 3 exposed at the other end of the multicore cable 2, and stores the measurement result (i.e., the number assigned to the other end portion of the insulated wire 3) in the storage unit 82 so as to be associated with the variable b.

In Step S55, the determination portion 812 determines whether or not the variable b is equal to n. When the determination is NO in Step S55, b is incremented in Step S56 and the process then returns to Step S54. When the determination is YES in Step S55, i.e., when measurement on end portions of all insulated wires 3 at the other end of the multicore cable 2 is finished, the determination portion 812 identifies that the number (the number assigned to the other end portion of the insulated wire 3) with a detection signal having the largest voltage is the other end portion of the $a^{th}$ insulated wire 3 currently being tested, and the identified correspondence relationship is stored in the storage unit 82.

In Step S58, the determination portion 812 determines whether or not the variable a is equal to n. When the determination is NO in Step S58, a is incremented and the variable b is reset to the initial value of 1 in Step S59, and the process returns to Step S53. When the determination is YES in Step S58, i.e., after the correspondence relationship in all insulated wires 3 is identified, the verifying portion 813 checks the correspondence relationship stored in the storage unit 82 and determines whether or not any of the numbers assigned to the insulated wires 3 at the other end is duplicated, in Step S60. When the determination is NO in Step S60, i.e., when there is no duplication, the process proceeds to Step S63.

When the determination is YES in Step S60, i.e., when there is a duplication, the verifying portion 813 controls the second switching device 53 through the switch controlling portion 811 and changes the insulated wire 3 to which the phase-inverted test signal V− is applied, in Step S61. After that, in Step S62, the verifying portion 813 controls the first and third switching devices 43 and 62 through the switch controlling portion 811 and retests the insulated wire 3 determined as having a duplication in Step S60. In Step S62, all the insulated wires 3 may be retested. In addition, when a duplication is found also in the retest result, the insulated wire 3 to which the phase-inverted test signal V− is applied is changed again and retested even though it is not shown in the drawing. The result of the retest is stored in the storage unit 82. In Step S63, the arithmetic device 8 outputs the correspondence relationship identification result, which is stored in the storage unit 82, to, e.g., a monitor, etc. After that, the process is ended.

Experimental Results

Figure 8:
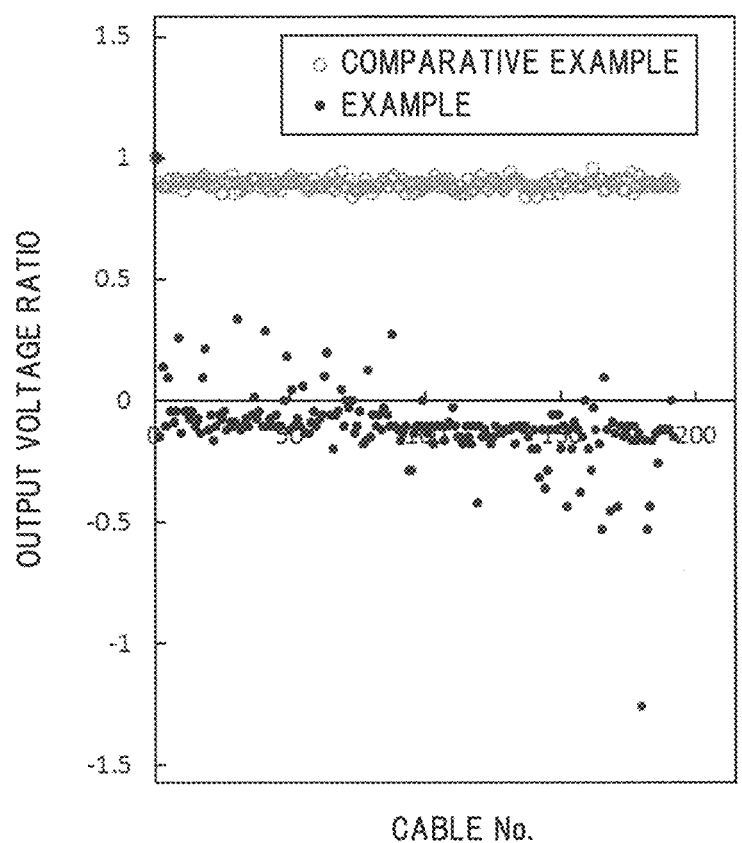
FIG. 8 is a graph showing a result of measuring voltage of detection signal obtained by the method for testing a multicore cable in the invention.

FIG. 8 is a graph showing a result of measuring voltage of detection signal obtained by the method for testing a multicore cable in the present embodiment. The vertical axis in FIG. 8 is an output voltage ratio normalized to the largest value of the obtained detection signal. The horizontal axis in FIG. 8 indicates the numbers assigned to the insulated wires 3 at the other end of the multicore cable 2. In addition, FIG. 8 also shows the experimental result of Comparative Example in which the phase-inverted test signal V− is not applied. In this experiment, the outer diameter of the coaxial wire 30 (the insulated wire 3) was about 0.3 mm, the number of the coaxial wires 30 was one hundred and ninety-two, the outer diameter of the multicore cable 2 was about 10 mm, and the entire length of the multicore cable 2 (the entire length of the coaxial wire 30) was about 2 meters.

As shown in FIG. 8, in Example according to the invention, voltage of the detection signal is large at an end portion of only one insulated wire 3, and voltages of the detection signals of the other insulated wires 3 are smaller. In other words, in Example, the SNR is large and it is thus possible to accurately identify the correspondence relationship between one end portion and the other end portion of the insulated wire 3. In addition, in Example according to the invention, it took about 0.3 seconds per insulated wire 3 to identify the correspondence relationship between one end portion and the other end portion. Thus, even when identifying the correspondence relationship between one end portion and the other end portion of as many as, e.g., not less than one hundred insulated wires 3, it is possible to perform processing in a relatively short time. On the other hand, in Comparative Example, a difference between the largest voltage of the detection signal and voltages of the other detection signals is small. Therefore, in Comparative Example, the SNR is close to 1 and it is difficult to accurately identify the correspondence relationship between one end portion and the other end portion of the insulated wire 3.

Functions and Effects of the Embodiment

As described above, in the method for testing a multicore cable in the present embodiment, the test signal V+ is input by capacitive coupling to an end portion of the tested insulated wire 3 among end portions of the insulated wires 3 exposed at one end of the multicore cable 2, the phase-inverted test signal V− in an opposite phase to that of the test signal V+ is input by capacitive coupling to an end portion of the insulated wire 3, other than the end portion of the tested insulated wire 3, among the end portions of the insulated wires 3 exposed at the one end of the multicore cable 2, voltages of output signals output by capacitive coupling respectively from end portions of the insulated wires 3 exposed at the other end of the multicore cable 2 are measured, and the other end portion of the tested insulated wire 3 is identified based on the measured voltages.

Since the test signal V+ and the phase-inverted test signal V− are both input, the two test signals V+ and V− cause crosstalk and cancel each other out in the other insulated wires 3 to which the test signals V+ and V− are not input. As a result, it is possible to reduce the effect of crosstalk and to accurately identify the correspondence relationship between one end portion and the other end portion of the insulated wires 3. The invention is particularly suitably applicable to the multicore cable 2 in which multiple insulated wires 3 are densely arranged and a coupling capacitance between the insulated wires 3 is large. In addition, use of the invention is highly effective in case that the multicore cable 2 has the common shield 21 since the coupling capacitance is larger than when not having the common shield 21.

To reduce crosstalk between the insulated wires 3, a coupling capacitance Cc between the electrodes 442/611 and the insulated wires 3 could be increased by increasing the length of the electrodes 442/611 and providing a larger contact area between the electrodes 442/611 and the insulated wires 3. In this case, however, the test bench 45 and the electrode substrates 44, 61 are increased in size. In addition, a portion of the insulated wire 3 to be exposed for the test is longer, which means that the insulated wire 3 needs to have a longer extra length which is removed at the time of installation to a substrate, etc., hence, wasteful. In the present embodiment, it is possible to accurately identify the correspondence relationship between one end portion and the other end portion of the insulated wires 3 even when the electrodes 442 and 611 are relatively short and a contact area between the electrodes 442/611 and the insulated wires 3 is relatively small.

Summary of the Embodiments

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A method for testing a multicore cable (2) comprising not less than three insulated wires (3) collectively covered with a jacket (22) to identify a correspondence relationship between one end portion and the other end portion of the insulated wires (3) exposed from both ends of the multicore cable (2), the testing method comprising: inputting a test signal, by capacitive coupling, to an end portion of the tested insulated wire (3) among end portions of the insulated wires (3) exposed at one end of the multicore cable (2); inputting a phase-inverted test signal in an opposite phase to that of the test signal, by capacitive coupling, to an end portion of the insulated wire (3), other than the end portion of the tested insulated wire (3), among the end portions of the insulated wires (3) exposed at the one end of the multicore cable (2); and measuring voltages of output signals output by capacitive coupling respectively from end portions of the insulated wires (3) exposed at the other end of the multicore cable (2) to identify the other end portion of the tested insulated wire (3) based on the measured voltages.

[2] The method for testing a multicore cable defined by [1], wherein the other end portion of the tested insulated wire (3) is identified based on voltage of a detection signal obtained by multiplying the output signal output from an end portion of each insulated wire (3) exposed at the other end of the multicore cable (2) by a reference signal having the same phase as the test signal.

[3] The method for testing a multicore cable defined by [2], wherein among the end portions of the insulated wires (3) exposed at the other end of the multicore cable (2), an end portion with the detection signal having the largest voltage is identified as the other end portion of the tested insulated wire (3).

[4] The method for testing a multicore cable defined by any one of [1] to [3], further comprising: determining whether an end portion of any of the insulated wire (3) exposed at one end of the multicore cable (2) corresponds to duplicate other end portions; and when there is a duplication, changing the insulated wire (3) to which the phase-inverted test signal is input to re-identify a correspondence relationship between one end portion and the other end portion of at least the tested insulated wire (3) having duplicate end portions at the other end.

[5] A method for manufacturing a multicore cable assembly that comprises a multicore cable (2) comprising not less than three insulated wires (3) collectively covered with a jacket (22) and connectors or circuit boards provided at both ends of the multicore cable (2), the manufacturing method comprising: arranging wires; stripping the insulated wires (3) to expose conductors at end portions; and connecting the exposed conductors to terminals of the connectors or electrode patterns of the circuit board, wherein the arranging wire comprises identifying a corresponding end portion by identifying a correspondence relationship between one end portion and the other end portion of the insulated wires (3) exposed from both ends of the multicore cable (2) and arranging end portions of the insulated wires (3) exposed from the both ends of the multicore cable (2) in desired order, and wherein the identifying of the corresponding end portion comprises: inputting a test signal, by capacitive coupling, to an end portion of the tested insulated wire (3) among end portions of the insulated wires (3) exposed at one end of the multicore cable (2); inputting a phase-inverted test signal in an opposite phase to that of the test signal, by capacitive coupling, to an end portion of the insulated wire (3), other than the end portion of the tested insulated wire (3), among the end portions of the insulated wires (3) exposed at the one end of the multicore cable (2); and measuring voltages of output signals output by capacitive coupling respectively from end portions of the insulated wires (3) exposed at the other end of the multicore cable (2) to identify the other end portion of the tested insulated wire (3) based on the measured voltages.

[6] A multicore cable test device (1) for testing a multicore cable (2) comprising not less than three insulated wires (3) collectively covered with a jacket (22) to identify a correspondence relationship between one end portion and the other end portion of the insulated wires (3) exposed from both ends of the multicore cable (2), the device comprising: a test signal input means (4) that inputs a test signal, by capacitive coupling, to an end portion of the tested insulated wire (3) among end portions of the insulated wires (3) exposed at one end of the multicore cable (2); a phase-inverted test signal input means (5) that inputs a phase-inverted test signal in an opposite phase to that of the test signal, by capacitive coupling, to an end portion of the insulated wire (3), other than the end portion of the tested insulated wire (3), among the end portions of the insulated wires (3) exposed at the one end of the multicore cable (2); and a corresponding-end identifying unit (81) that measures output voltages output by capacitive coupling respectively from end portions of the insulated wires (3) exposed at the other end of the multicore cable (2) to identify the other end portion of the tested insulated wire (3) based on the measured output voltages.

Although the embodiment of the invention has been described, the invention according to claims is not to be limited to the embodiment. Further, please note that all combinations of the features described in the embodiment are not necessary to solve the problem of the invention.

The invention can be appropriately modified and implemented without departing from the gist thereof. For example, although an end portion of the insulated wire 3 to which the test signal V+ is input is detected by obtaining the largest value of the detection voltage in the embodiment, an end portion of the insulated wire 3 to which the phase-inverted test signal V− is input can be simultaneously detected by obtaining the smallest value of the detection voltage. This is possible because when signals at the same frequency and with opposite phases are multiplied with each other by the multiplier 64, a negative DC signal is output as a detection signal.

Alternatively, after identifying the correspondence relationship between one end portion and the other end portion of one or more insulated wires 3, the phase-inverted test signal V− may be input to an end portion of the already-identified insulated wire 3. This prevents the test signal V+ and the phase-inverted test signal V− from being input to a single insulated wire 3 and it is thereby possible to prevent an increase in test time due to retesting.

What is claimed is:

1. A method for testing a multicore cable comprising at least three insulated wires collectively covered with a jacket to identify a correspondence relationship between one end portion and an other end portion of the insulated wires exposed from both ends of the multicore cable, the testing method comprising:
inputting a test signal, by capacitive coupling, to an end portion of the tested insulated wire among end portions of the insulated wires exposed at one end of the multicore cable;
inputting a phase-inverted test signal in an opposite phase to that of the test signal, by capacitive coupling, to an end portion of the insulated wire, other than the end portion of the tested insulated wire, among the end portions of the insulated wires exposed at the one end of the multicore cable;
wherein the phase-inverted test signal is generated from a phase shifter by shifting phase of the test signal or the phase-inverted test signal is generated from a voltage source; and
measuring voltages of output signals output by capacitive coupling respectively from end portions of the insulated wires exposed at the other end of the multicore cable to identify an other end portion of the tested insulated wire based on the measured voltages.

2. The method according to claim 1, wherein the other end portion of the tested insulated wire is identified based on voltage of a detection signal obtained by multiplying the output signal output from an end portion of each insulated wire exposed at the other end of the multicore cable by a reference signal having the same phase as the test signal.

3. The method according to claim 2, wherein among the end portions of the insulated wires exposed at the other end of the multicore cable, an end portion with the detection signal having the largest voltage is identified as the other end portion of the tested insulated wire.

4. The method according to claim 1, further comprising:
   determining whether an end portion of any of the insulated wire exposed at one end of the multicore cable corresponds to duplicate other end portions; and
   when there is a duplication, changing the insulated wire to which the phase-inverted test signal is input to re-identify a correspondence relationship between one end portion and the other end portion of at least the tested insulated wire having duplicate end portions at the other end.

5. A method for manufacturing a multicore cable assembly that comprises a multicore cable comprising at least three insulated wires collectively covered with a jacket and connectors or circuit boards provided at both ends of the multicore cable, the manufacturing method comprising:
   arranging wires;
   stripping the insulated wires to expose conductors at end portions; and connecting the exposed conductors to terminals of the connectors or electrode patterns of the circuit board,
   wherein the arranging wire comprises identifying a corresponding end portion by identifying a correspondence relationship between one end portion and an other end portion of the insulated wires exposed from both ends of the multicore cable and arranging end portions of the insulated wires exposed from the both ends of the multicore cable in desired order, and
   wherein the identifying of the corresponding end portion comprises: inputting a test signal, by capacitive coupling, to an end portion of the tested insulated wire among end portions of the insulated wires exposed at one end of the multicore cable;
   inputting a phase-inverted test signal in an opposite phase to that of the test signal, by capacitive coupling, to an end portion of the insulated wire, other than the end portion of the tested insulated wire, among the end portions of the insulated wires exposed at the one end of the multicore cable;
   wherein the phase-inverted test signal is generated from a phase shifter by shifting phase of the test signal or the phase-inverted test signal is generated from a voltage source; and
   measuring voltages of output signals output by capacitive coupling respectively from end portions of the insulated wires exposed at an other end of the multicore cable to identify the other end portion of the tested insulated wire based on the measured voltages.

6. A multicore cable test device for testing a multicore cable comprising at least three insulated wires collectively covered with a jacket to identify a correspondence relationship between one end portion and an other end portion of the insulated wires exposed from both ends of the multicore cable, the device comprising:
   a test signal input that inputs a test signal, by capacitive coupling, to an end portion of the tested insulated wire among end portions of the insulated wires exposed at one end of the multicore cable;
   a phase inverter that inputs a phase-inverted test signal in an opposite phase to that of the test signal, by capacitive coupling, to an end portion of the insulated wire, other than the end portion of the tested insulated wire, among the end portions of the insulated wires exposed at the one end of the multicore cable;
   wherein the phase-inverted test signal is generated by shifting phase of the test signal or the phase-inverted test signal is generated from a voltage source; and
   a processor configured to measure output voltages output by capacitive coupling respectively from end portions of the insulated wires exposed at an other end of the multicore cable to identify the other end portion of the tested insulated wire based on the measured output voltages.

7. A method for testing a multicore cable comprising at least three insulated wires collectively covered with a jacket to identify a correspondence relationship between one end portion and an other end portion of the insulated wires exposed from both ends of the multicore cable, the testing method comprising:
   inputting a test signal, by capacitive coupling, to an end portion of the tested insulated wire among end portions of the insulated wires exposed at one end of the multicore cable, the insulated wires not under test not being grounded;
   inputting a phase-inverted test signal in an opposite phase to that of the test signal, by capacitive coupling, to an end portion of the insulated wire, other than the end portion of the tested insulated wire, among the end portions of the insulated wires exposed at the one end of the multicore cable;
   wherein the phase-inverted test signal is generated from a phase shifter by shifting phase of the test signal or the phase-inverted test signal is generated from a voltage source; and
   measuring voltages of output signals output by capacitive coupling respectively from end portions of the insulated wires exposed at the other end of the multicore cable to identify an other end portion of the tested insulated wire based on the measured voltages.

8. The method according to claim 7, wherein the other end portion of the tested insulated wire is identified based on voltage of a detection signal obtained by multiplying the output signal output from an end portion of each insulated wire exposed at the other end of the multicore cable by a reference signal having the same phase as the test signal.

9. The method according to claim 8, wherein among the end portions of the insulated wires exposed at the other end of the multicore cable, an end portion with the detection signal having the largest voltage is identified as the other end portion of the tested insulated wire.

10. The method according to claim 7, further comprising:
    determining whether an end portion of any of the insulated wire exposed at one end of the multicore cable corresponds to duplicate other end portions; and
    when there is a duplication, changing the insulated wire to which the phase-inverted test signal is input to re-identify a correspondence relationship between one end portion and the other end portion of at least the tested insulated wire having duplicate end portions at the other end.

11. A method for manufacturing a multicore cable assembly that comprises a multicore cable comprising at least three insulated wires collectively covered with a jacket and connectors or circuit boards provided at both ends of the multicore cable, the manufacturing method comprising:
    arranging wires;
    stripping the insulated wires to expose conductors at end portions; and connecting the exposed conductors to terminals of the connectors or electrode patterns of the circuit board,
    wherein the arranging wire comprises identifying a corresponding end portion by identifying a correspondence relationship between one end portion and an other end portion of the insulated wires exposed from both ends of the multicore cable and arranging end portions of the insulated wires exposed from the both ends of the multicore cable in desired order, and wherein the identifying of the corresponding end portion comprises: inputting a test signal, by capacitive coupling, to an end portion of the tested insulated wire among end portions of the insulated wires exposed at one end of the multicore cable, the insulated wires not under test not being grounded;

inputting a phase-inverted test signal in an opposite phase to that of the test signal, by capacitive coupling, to an end portion of the insulated wire, other than the end portion of the tested insulated wire, among the end portions of the insulated wires exposed at the one end of the multicore cable; and wherein the phase-inverted test signal is generated from a phase shifter by shifting phase of the test signal or the phase-inverted test signal is generated from a voltage source; and measuring voltages of output signals output by capacitive coupling respectively from end portions of the insulated wires exposed at an other end of the multicore cable to identify the other end portion of the tested insulated wire based on the measured voltages.

12. A multicore cable test device for testing a multicore cable comprising at least three insulated wires collectively covered with a jacket to identify a correspondence relationship between one end portion and an other end portion of the insulated wires exposed from both ends of the multicore cable, the device comprising:

a test signal input that inputs a test signal, by capacitive coupling, to an end portion of the tested insulated wire among end portions of the insulated wires exposed at one end of the multicore cable, the insulated wires not under test not being grounded;

a phase-inverter that inputs a phase-inverted test signal in an opposite phase to that of the test signal, by capacitive coupling, to an end portion of the insulated wire, other than the end portion of the tested insulated wire, among the end portions of the insulated wires exposed at the one end of the multicore cable;

wherein the phase-inverted test signal is generated by shifting phase of the test signal or the phase-inverted test signal is generated from a voltage source; and a processor configured to measure output voltages output by capacitive coupling respectively from end portions of the insulated wires exposed at an other end of the multicore cable to identify the other end portion of the tested insulated wire based on the measured output voltages.

* * * * *